(12) United States Patent
Gejo et al.

(10) Patent No.: US 11,824,056 B2
(45) Date of Patent: Nov. 21, 2023

(54) TRENCH GATE IGBT WITH CARRIER TRAP UNDER THE CONTROL ELECTRODE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryohei Gejo, Kawasaki (JP); Akiyo Minamikawa, Nomi (JP); Shigeaki Hayase, Kanazawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 250 days.

(21) Appl. No.: 17/472,457

(22) Filed: Sep. 10, 2021

(65) Prior Publication Data

US 2022/0246606 A1   Aug. 4, 2022

(30) Foreign Application Priority Data

Jan. 29, 2021   (JP) ................................. 2021-012793

(51) Int. Cl.
  *H01L 27/07*   (2006.01)
  *H01L 29/06*   (2006.01)
  (Continued)

(52) U.S. Cl.
  CPC ...... *H01L 27/0727* (2013.01); *H01L 29/0619* (2013.01); *H01L 29/41708* (2013.01); *H01L 29/7397* (2013.01)

(58) Field of Classification Search
  CPC ............. H01L 27/0727; H01L 29/7397; H01L 29/7395; H01L 29/0696; H01L 29/402;
  (Continued)

(56) References Cited

U.S. PATENT DOCUMENTS 8,748,236 B2   6/2014   Tanida
9,257,543 B2   2/2016   Takahashi
(Continued)

FOREIGN PATENT DOCUMENTS

JP        6119577 B2    4/2017
JP        6232687 B2   11/2017
(Continued)

*Primary Examiner* — Wasiul Haider
(74) *Attorney, Agent, or Firm* — Allen & Overy LLP

(57) ABSTRACT

A semiconductor device includes a semiconductor part, first and second electrodes, a control electrode and a control interconnect. The semiconductor part includes first to sixth layers and is provided between the first and second electrodes. The second layer is provided between the first layer and the second electrode. The third layer is provided between the second layer and the second electrode. The fourth and fifth layers are arranged between the first layer and the first electrode. The second electrode and the control interconnect are arranged on the semiconductor part. The control electrode is provided between the second electrode and the semiconductor part. The sixth layer is provided between the first layer and the control interconnect. The fifth semiconductor layer is provided between the first electrode and the sixth layer. The first semiconductor layer includes a carrier trap provided between the fifth and sixth layers.

14 Claims, 5 Drawing Sheets

(51) Int. Cl.
*H01L 29/417* (2006.01)
*H01L 29/739* (2006.01)

(58) Field of Classification Search
CPC ............. H01L 29/0603; H01L 29/0684; H01L 29/66333; H01L 29/7412; H01L 29/7416
See application file for complete search history.

(56) References Cited

U.S. PATENT DOCUMENTS

| | | |
|---|---|---|
| 9,685,523 B2 | 6/2017 | Bobde et al. |
| 10,643,992 B2 | 5/2020 | Naito |
| 2017/0271451 A1 | 9/2017 | Matsushita et al. |
| 2019/0081162 A1 | 3/2019 | Gejo et al. |
| 2019/0259747 A1* | 8/2019 | Gejo ................... H01L 29/0623 |
| 2020/0058735 A1 | 2/2020 | Naito |
| 2020/0161460 A1 | 5/2020 | Harada et al. |

FOREIGN PATENT DOCUMENTS

| | | |
|---|---|---|
| JP | 2017-228790 A | 12/2017 |
| JP | 2019-54070 A | 4/2019 |

\* cited by examiner

TRENCH GATE IGBT WITH CARRIER TRAP UNDER THE CONTROL ELECTRODE

CROSS-REFERENCE TO RELATED APPLICATIONS

This application is based upon and claims the benefit of priority from Japanese Patent Application No. 2021-012793, filed on Jan. 29, 2021; the entire contents of which are incorporated herein by reference.

FIELD

Embodiments relate to a semiconductor device.

BACKGROUND

It is desirable for a power control semiconductor device to withstand a large current. For example, there is a semiconductor device in which an IGBT (Insulated Gate Bipolar Transistor) and a diode are integrated. In such a configuration, the device structure for improving the switching characteristics may reduce the current withstand.

DETAILED DESCRIPTION

Figure 1:
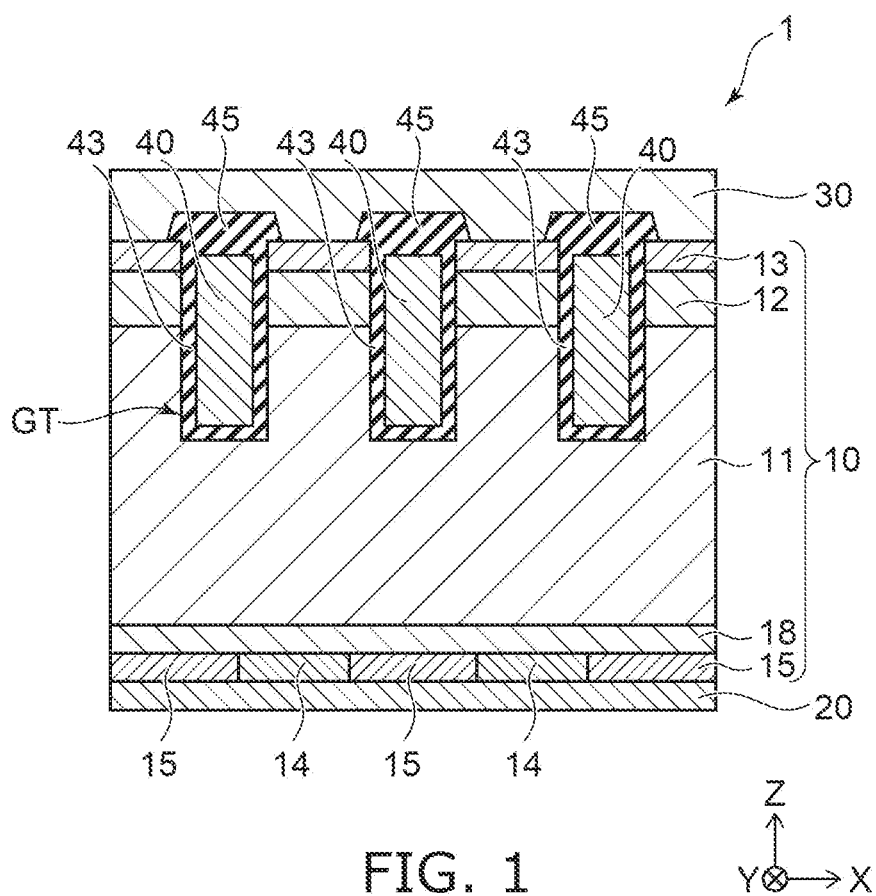
FIG. 1 is a schematic cross-sectional view showing a semiconductor device according to an embodiment.

According to an embodiment, a semiconductor device includes a semiconductor part, a first electrode, at least one second electrode, a control electrode and a control interconnect. The semiconductor part includes a first semiconductor layer of a first conductivity type, a second semiconductor layer of a second conductivity type, a third semiconductor layer of the first conductivity type, a fourth semiconductor layer of the second conductivity type, a fifth semiconductor layer of the first conductivity type, and a sixth semiconductor layer of the second conductivity type. The first electrode is provided on a back surface of the semiconductor part. The at least one second electrode is provided on a front surface of the semiconductor part. The first semiconductor layer extends between the first electrode and the second electrode. The second semiconductor layer is provided between the first semiconductor layer and the second electrode. The third semiconductor layer is provided between the second semiconductor layer and the second electrode. The third semiconductor layer is electrically connected to the second electrode. The fourth semiconductor layer and the fifth semiconductor layer are provided between the first semiconductor layer and the first electrode. The fourth and fifth semiconductor layers are arranged along the back surface of the semiconductor part. The fourth and fifth semiconductor layers are electrically connected to the first electrode. The control electrode is provided between the semiconductor part and the second electrode. The semiconductor part having a trench provided at the front surface side. The control electrode is provided in the trench. The control electrode is electrically insulated from the semiconductor part by a first insulating film covering an inner surface of the trench. The control electrode is electrically insulated from the second electrode by a second insulating film. The control electrode faces the first and second semiconductor layers via the first insulating film. The control interconnect is provided on the front surface of the semiconductor part with a third insulating film interposed. The control interconnect is apart from the second electrode and electrically connected to the control electrode. The sixth semiconductor layer is provided between the first semiconductor layer and the control interconnect. The fifth semiconductor layer includes a portion provided between the first electrode and the sixth semiconductor layer. The first semiconductor layer includes a carrier trap provided at least between the fifth semiconductor layer and the sixth semiconductor layer. The sixth semiconductor layer includes a second-conductivity-type impurity with a higher concentration than a concentration of a second-conductivity-type impurity in the second semiconductor layer. The sixth semiconductor layer is connected to the second semiconductor layer and electrically connected to the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is a so-called reverse-conducting IGBT in which an IGBT and a diode are integrated.

As shown in FIG. 1, the semiconductor device 1 includes a semiconductor part 10, a first electrode 20, a second electrode 30, and a control electrode 40. The semiconductor part 10 is, for example, silicon.

The first electrode 20 is provided on the back surface of the semiconductor part 10. The first electrode 20 is, for example, a collector electrode. The second electrode 30 is provided on the front surface of the semiconductor part 10. The second electrode 30 is, for example, an emitter electrode. The first electrode 20 and the second electrode 30 are, for example, metals that include aluminum.

The semiconductor part 10 includes a first semiconductor layer 11 of a first conductivity type, a second semiconductor layer 12 of a second conductivity type, a third semiconductor layer 13 of the first conductivity type, a fourth semiconductor layer 14 of the second conductivity type, a fifth semiconductor layer 15 of the first conductivity type, a sixth semiconductor layer 16 of the second conductivity type (referring to FIG. 2B), a seventh semiconductor layer 17 of the second conductivity type (referring to FIG. 2B), and an eighth semiconductor layer 18 of the first conductivity type. Hereinbelow, the first conductivity type is described as an n-type; and the second conductivity type is described as a p-type.

The first semiconductor layer 11 extends between the first electrode 20 and the second electrode 30. The first semiconductor layer 11 is, for example, an n-type base layer.

The second semiconductor layer 12 is provided between the first semiconductor layer 11 and the second electrode 30. The second semiconductor layer 12 is, for example, a p-type base layer.

The third semiconductor layer 13 is provided between the second semiconductor layer 12 and the second electrode 30. The third semiconductor layer 13 is electrically connected to the second electrode 30. The third semiconductor layer 13 is, for example, an n-type emitter layer. The third semiconductor layer 13 includes a first-conductivity-type impurity with a higher concentration than the concentration of the first-conductivity-type impurity in the first semiconductor layer 11.

The fourth semiconductor layer 14 and the fifth semiconductor layer 15 are provided between the first semiconductor layer 11 and the first electrode 20. The fourth semiconductor layer 14 and the fifth semiconductor layer 15 are arranged along the first electrode 20. The fourth semiconductor layer 14 and the fifth semiconductor layer 15 each are electrically connected to the first electrode 20. The fourth semiconductor layer 14 is, for example, a p-type collector layer. The fifth semiconductor layer 15 is, for example, an n-type cathode layer. The fifth semiconductor layer 15 includes a first-conductivity-type impurity with a higher concentration than the concentration of the first-conductivity-type impurity in the first semiconductor layer 11.

The eighth semiconductor layer 18 is provided between the first semiconductor layer 11 and the fourth semiconductor layer 14. The eighth semiconductor layer 18 is provided also between the first semiconductor layer 11 and the fifth semiconductor layer 15. The eighth semiconductor layer 18 is, for example, an n-type buffer layer. The eighth semiconductor layer 18 includes a first-conductivity-type impurity with a higher concentration than the concentration of the first-conductivity-type impurity in the first semiconductor layer 11. Also, the concentration of the first-conductivity-type impurity in the eighth semiconductor layer 18 is less than the concentration of the first-conductivity-type impurity in the fifth semiconductor layer 15.

The control electrode 40 is provided between the semiconductor part 10 and the second electrode 30. The control electrode 40 is, for example, a gate electrode. The semiconductor part 10 includes a trench GT provided at the front surface side; and the control electrode 40 is provided inside the trench GT. The control electrode 40 is, for example, conductive polysilicon.

The control electrode 40 is electrically insulated from the semiconductor part 10 by a first insulating film 43. The first insulating film 43 is, for example, a gate insulating film. Also, the control electrode 40 is electrically insulated from the second electrode 30 by a second insulating film 45. The second insulating film 45 is, for example, an inter-layer insulating film. The first insulating film 43 and the second insulating film 45 are, for example, silicon oxide films.

The trench GT of the semiconductor part 10 has a depth enough to extend into the first semiconductor layer 11 from the upper surface of the third semiconductor layer 13. The first insulating film 43 includes a portion that is provided between the first semiconductor layer 11 and the control electrode 40, and another portion that is provided between the second semiconductor layer 12 and the control electrode 40. The third semiconductor layer 13 contacts the first insulating film 43 between the second semiconductor layer 12 and the second electrode 30.

The semiconductor device 1 includes multiple fourth semiconductor layers 14 and multiple fifth semiconductor layers 15. The fourth semiconductor layers 14 and the fifth semiconductor layers 15 are alternately arranged along the first electrode 20 between the first electrode 20 and the eighth semiconductor layer 18. Thereby, the semiconductor device 1 operates in both an IGBT mode and a diode mode.

Figure 2A:
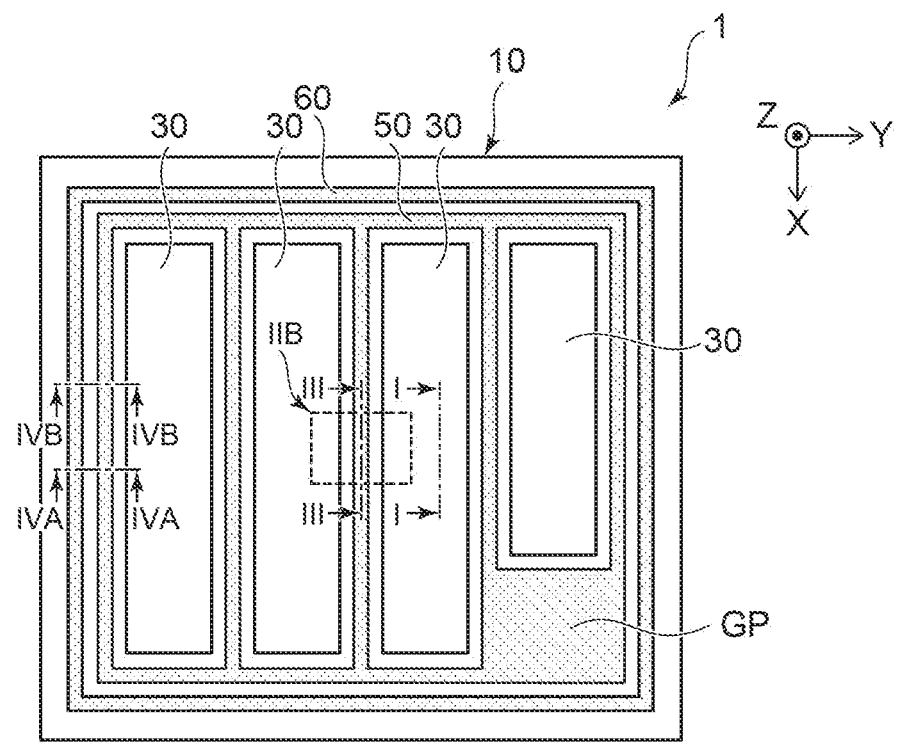
FIGS. 2A and 2B are schematic views showing the semiconductor device according to the embodiment.
Figure 2B:
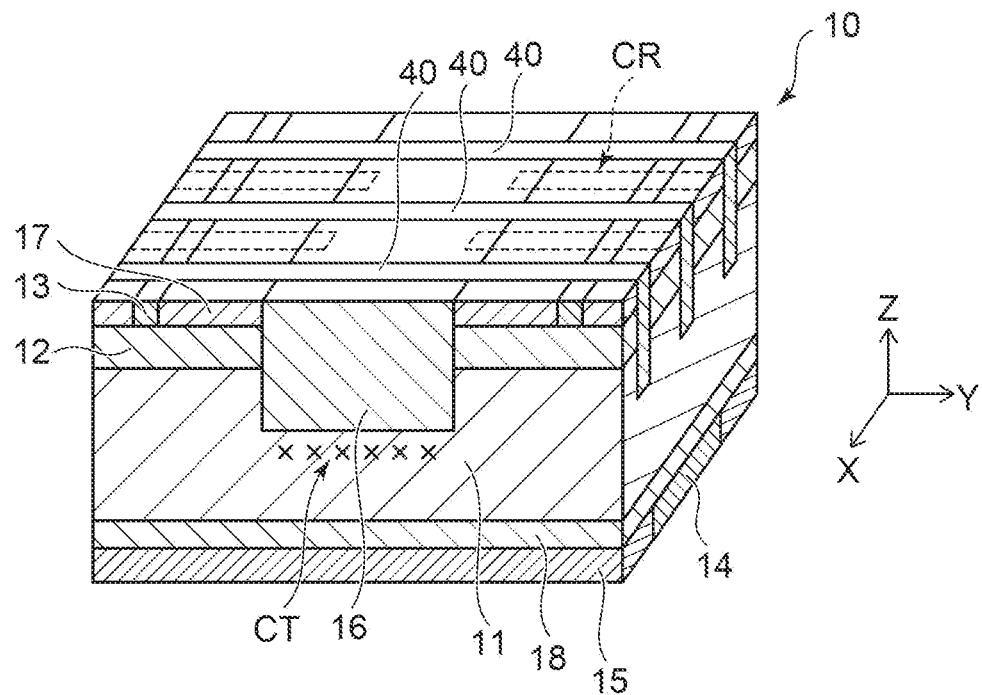

FIGS. 2A and 2B are schematic views showing the semiconductor device 1 according to the embodiment. FIG. 2A is a plan view illustrating the front surface side of the semiconductor device 1. FIG. 2B is a perspective view showing a portion of the semiconductor part 10 corresponding to the region IIB shown by a broken line in FIG. 2A. FIG. 1 is a cross-sectional view along line I-I shown in FIG. 2A.

As shown in FIG. 2A, the semiconductor device 1 includes the multiple second electrodes 30, a control interconnect 50, a field plate 60, and a control pad GP. The control interconnect 50, the field plate 60, and the control pad GP are, for example, metals that include aluminum.

For example, the second electrodes 30 extend in an X-direction and are arranged in a Y-direction at the front surface side of the semiconductor part 10. The control interconnect 50 surrounds the multiple second electrodes 30. The control interconnect 50 also extends between the adjacent second electrodes 30. The control interconnect 50 is electrically connected to the control pad GP. The multiple second electrodes 30 and the control interconnect 50 are apart from each other and are electrically isolated.

The field plate 60 surrounds the control interconnect 50. The field plate 60 is apart from the control interconnect 50 and electrically isolated from the control interconnect 50.

As shown in FIG. 2B, the semiconductor part 10 further includes the sixth semiconductor layer 16 of the second conductivity type and the seventh semiconductor layer 17 of the second conductivity type. The first insulating film 43 (referring to FIG. 1) is not illustrated in FIG. 2B.

The sixth semiconductor layer 16 is provided between the first semiconductor layer 11 and the control interconnect 50 (referring to FIG. 2A). The sixth semiconductor layer 16 extends in the X-direction along the control interconnect 50. The sixth semiconductor layer 16 has a thickness enough to extend from the upper surface of the third semiconductor layer 13 into the first semiconductor layer 11 in a direction from the first electrode 20 toward the second electrode 30 (e.g., the Z-direction).

The sixth semiconductor layer 16 includes a second-conductivity-type impurity with a higher concentration than the concentration of the second-conductivity-type impurity in the second semiconductor layer 12. The second semiconductor layer 12 is connected to the sixth semiconductor layer 16.

The seventh semiconductor layer 17 is provided between the second semiconductor layer 12 and the second electrode 30 (not illustrated). For example, the third semiconductor layer 13 and the seventh semiconductor layer 17 are arranged in a direction along the upper surface of the second semiconductor layer 12 (e.g., the Y-direction). The seventh semiconductor layer 17 is, for example, a p-type contact layer. The seventh semiconductor layer 17 includes a second-conductivity-type impurity with a higher concentration than the concentration of the second-conductivity-type impurity in the second semiconductor layer 12.

A region CR shown in FIG. 2B illustrates a contact region in which the second electrode 30 contacts the semiconductor part 10. The region CR extends over the third semiconductor layer 13, the seventh semiconductor layer 17, and the sixth semiconductor layer 16. In other words, the third semiconductor layer 13, the seventh semiconductor layer 17, and the sixth semiconductor layer 16 are electrically connected to the second electrode 30 in the region CR. The second semiconductor layer 12 is electrically connected to the second electrode 30 via the seventh semiconductor layer 17.

As shown in FIG. 2B, the semiconductor part 10 further includes a carrier trap CT that is provided between the fifth semiconductor layer 15 and the sixth semiconductor layer 16. The carrier trap CT is provided, for example, in the first semiconductor layer 11. The carrier trap CT is distributed in the Z-direction such that the center of the distribution is positioned in the first semiconductor layer 11, and the distance in the Z-direction from the center of the distribution to the fifth semiconductor layer 15 (or the first electrode 20) is greater than the distance in the Z-direction from the center of the distribution to the sixth semiconductor layer 16. Here, "the center of the distribution" is, for example, the position at which the density of the carrier trap CT has a maximum. When the distribution of the carrier trap CT includes a region in which the density of the carrier trap CT is equal to a constant or more, the center in the Z-direction of the region may be taken to be "the center of the distribution".

Figure 3:
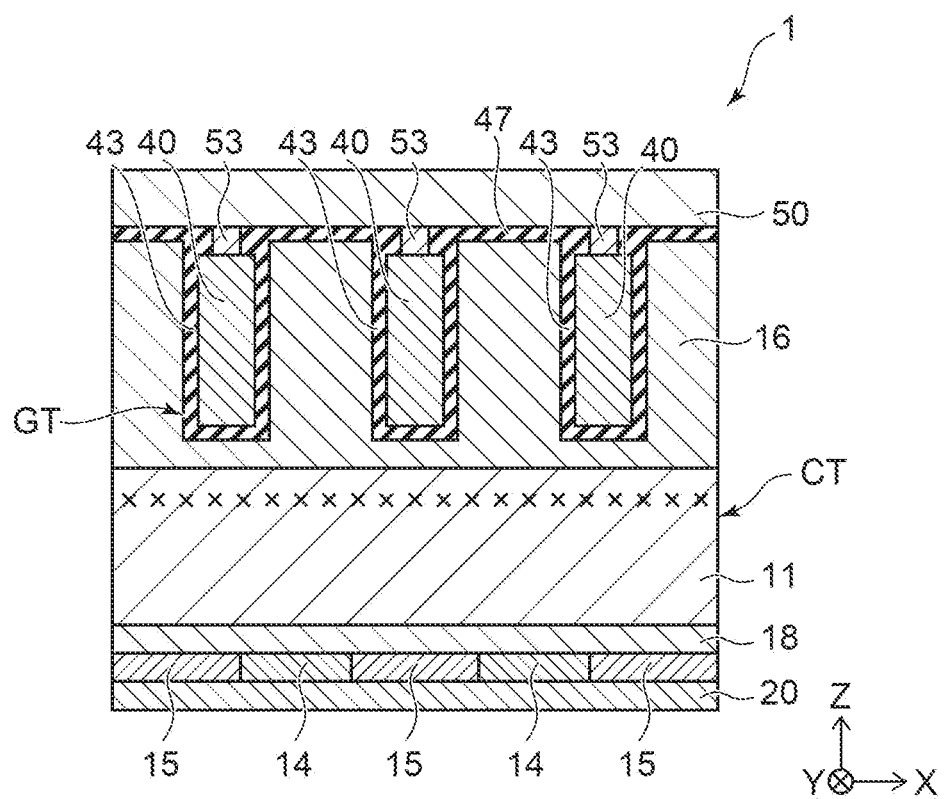
FIG. 3 is another schematic cross-sectional view showing the semiconductor device according to the embodiment.

The carrier trap CT is formed by, for example, the ion-implantation of hydrogen atoms (H) or helium atoms (He) into the semiconductor part 10. For example, crystal defects are formed by the ion implantation, and may form deep levels in an energy band gap of the semiconductor. Such deep levels trap carriers (electrons and holes) in the semiconductor and mediate recombination thereof. In other words, such deep levels act as carrier traps or carrier killers. In other words, by providing the carrier trap CT, the holes and electrons in the first semiconductor layer 11 are recombined therethrough, and the carrier density may be reduced. The carrier trap CT is also formed in the semiconductor by diffusing metal atoms such as platinum (Pt), etc, FIG. 3 is another schematic cross-sectional view showing the semiconductor device 1 according to the embodiment. FIG. 3 is a cross-sectional view along line shown in FIG. 2A.

As shown in FIG. 3, the sixth semiconductor layer 16 is provided between the first semiconductor layer 11 and the control interconnect 50. A third insulating film 47 is provided between the sixth semiconductor layer 16 and the control interconnect 50. The sixth semiconductor layer 16 is electrically insulated from the control interconnect 50 by the third insulating film 47.

The thickness in the Z-direction of the sixth semiconductor layer 16 is greater than the depth in the Z-direction of the trench GT. In other words, the sixth semiconductor layer 16 includes a portion that is positioned between the first semiconductor layer 11 and the control electrode 40.

The control electrode 40 is electrically connected to the control interconnect 50. The control electrode 40 is electrically connected to the control interconnect 50 via a contact portion 53 of the control interconnect 50. For example, the contact portion 53 extends in a contact hole that is provided in the third insulating film 47.

The fifth semiconductor layer 15 is provided between the first electrode 20 and the sixth semiconductor layer 16. The fourth semiconductor layer 14 and the fifth semiconductor layer 15 are alternately arranged between the first electrode 20 and the sixth semiconductor layer 16. The fourth semiconductor layer 14 and the fifth semiconductor layer 15 are alternately arranged in a direction along the surface of the first electrode 20 (e.g., the X-direction).

The carrier trap CT is provided between the fifth semiconductor layer 15 and the sixth semiconductor layer 16. Also, the carrier trap CT is provided between the fourth semiconductor layer 14 and the sixth semiconductor layer 16.

According to the embodiment, the conduction characteristics of the semiconductor device 1 may be improved by providing the sixth semiconductor layer 16.

In the diode mode of a reverse-conducting IGBT, for example, that does not include the sixth semiconductor layer 16 (referring to FIG. 1), when a gate voltage that is greater than a threshold voltage is applied to the control electrode 40, an inversion layer is induced at the interface between the first insulating film 43 and the second semiconductor layer 12. Thereby, electrons are injected from the fifth semiconductor layer 15 into the first semiconductor layer 11; and electrons flow from the first semiconductor layer 11 into the third semiconductor layer 13 via the inversion layer. For example, when the forward voltage that is applied between the first electrode 20 and the second electrode 30 is small, the forward current flows through the inversion layer that is induced by the control electrode 40. As the forward voltage becomes large, holes are injected from the second semiconductor layer 12 into the first semiconductor layer 11; and the forward current rapidly increases. Then, so-called snapback occurs in which the forward voltage decreases as the forward current increases.

In the semiconductor device 1, the snapback in the diode mode can be suppressed without affecting the operation of the IGBT mode by providing the sixth semiconductor layer 16 in the region directly under the control interconnect 50. In other words, the sixth semiconductor layer 16 includes a second-conductivity-type impurity with a higher concentration than the concentration of the second-conductivity-type impurity in the second semiconductor layer 12; therefore, holes are injected from the sixth semiconductor layer 16 into the first semiconductor layer 11 even when the forward voltage applied between the first electrode 20 and the second electrode 30 is small. The sixth semiconductor layer 16 reduces the ramp-up voltage of the forward current, and suppresses the snapback.

However, the carrier density of the first semiconductor layer 11 increases in the on-state of the diode mode by the hole injection from the sixth semiconductor layer 16. Therefore, when transitioning to the off-state of the diode mode, there may be a case in which an overcurrent due to the increase of the carriers ejected from the first semiconductor layer 11 flows through the contact region between the second electrode 30 and the sixth semiconductor layer 16, which breaks the device.

In the semiconductor device 1, the control interconnect 50 is provided on the sixth semiconductor layer 16. Therefore, the contact area between the second electrode 30 and the sixth semiconductor layer 16 is limited (referring to FIG. 2B). Therefore, when transitioning from the on-state to the off-state of the diode mode (the turn-off process), the current easily concentrates in a region directly under the sixth semiconductor layer 16 through the path ejecting the carriers from the first semiconductor layer 11 to the second electrode 30. In other words, a structure in which the overcurrent easily flows may be provided by the sixth semiconductor layer 16.

To suppress such an overcurrent, the hole injection from the sixth semiconductor layer 16 may be suppressed by, for example, not providing the fifth semiconductor layer 15 between the first electrode 20 and the sixth semiconductor layer 16. However, the advantage of suppressing the snapback is lost in such a structure.

In the semiconductor device 1 according to the embodiment, the carrier density in the first semiconductor layer 11 is reduced by providing the carrier trap CT between the fifth semiconductor layer 15 and the sixth semiconductor layer 16.

Figure 4A:
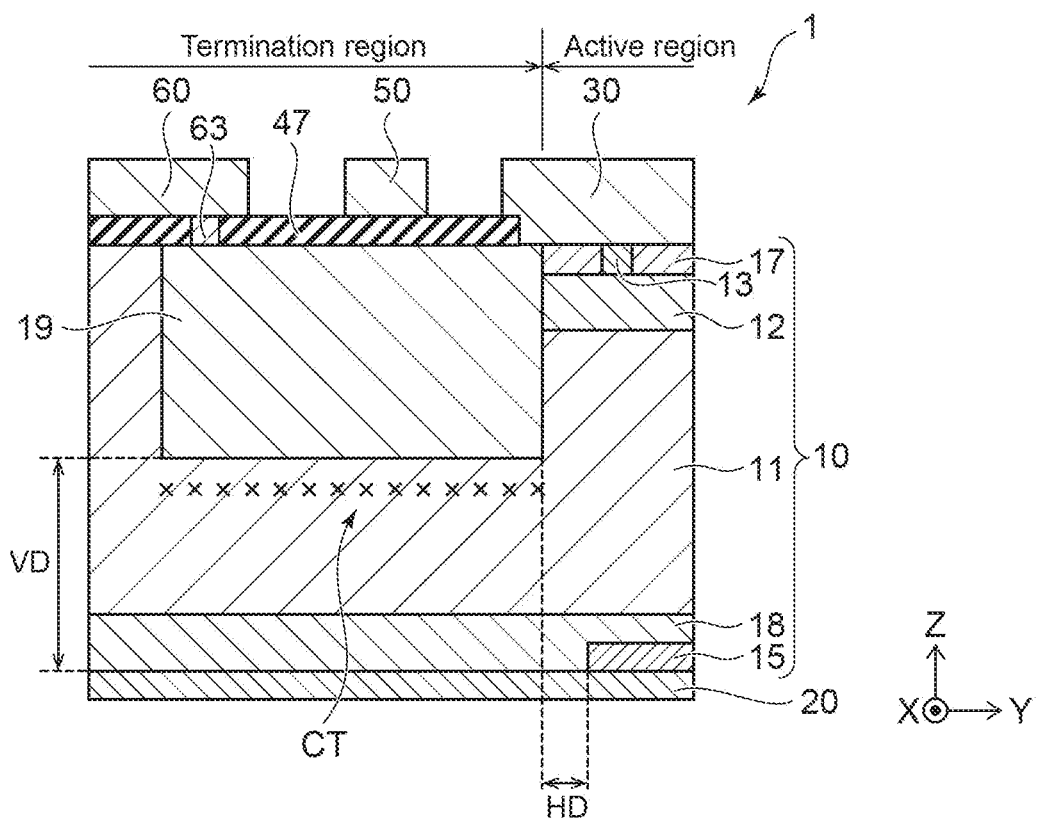
FIGS. 4A and 4B are other schematic cross-sectional views showing the semiconductor device according to the embodiment.
Figure 4B:
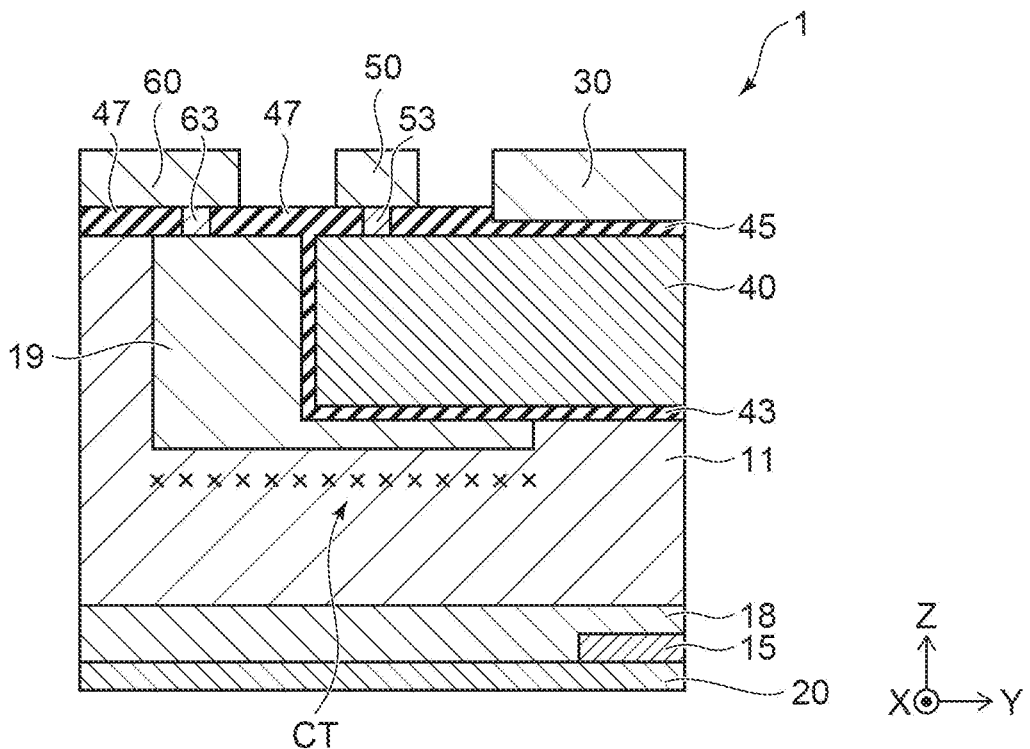

The overcurrent in the turn-off process can be suppressed thereby. Thus, it is possible in the semiconductor device 1 to suppress both the overcurrent and the snapback in the operation of the diode mode, FIGS. 4A and 4B are other schematic cross-sectional views showing the semiconductor device according to the embodiment. FIG. 4A is a cross-sectional view along line IVA-IVA shown in FIG. 2A. FIG. 4B is a cross-sectional view along line IVB-IVB shown in FIG. 2A.

As shown in FIG. 4A, the semiconductor device 1 includes an active region and a termination region. The active region includes, for example, the second semiconductor layer 12, the third semiconductor layer 13, and the seventh semiconductor layer 17. The termination region surrounds the active region.

The semiconductor part 10 further includes a ninth semiconductor layer 19 of the second conductivity type. The ninth semiconductor layer 19 is provided in the termination region and extends along the boundary between the active region and the termination region. The ninth semiconductor layer 19 is, for example, a p-type guard ring. The ninth semiconductor layer 19 includes a second-conductivity-type impurity with a higher concentration than the concentration of the second-conductivity-type impurity in the second semiconductor layer 12.

The control interconnect 50 includes a portion that is provided on the ninth semiconductor layer 19 and extends along the boundary between the active region and the termination region (referring to FIG. 2A). The third insulating film 47 is provided between the control interconnect 50 and the ninth semiconductor layer 19. The control interconnect 50 is electrically insulated from the ninth semiconductor layer 19 by the third insulating film 47.

The field plate 60 is provided on the ninth semiconductor layer 19 with the third insulating film 47 interposed. Moreover, the field plate 60 extends outward over the outer edge of the ninth semiconductor layer 19. The field plate 60 is electrically connected to the ninth semiconductor layer 19 via a contact portion 63. The contact portion 63 extends in a contact hole that is provided in the third insulating film 47. The field plate 60 is provided to increase the breakdown voltage at the outer edge of the ninth semiconductor layer 19, i.e., the breakdown voltage of the termination part.

As shown in FIG. 4A, the ninth semiconductor layer 19 is provided between the first semiconductor layer 11 and the control interconnect 50. The ninth semiconductor layer 19 has a thickness in the Z-direction enough to extend into the first semiconductor layer 11 from the front surface of the semiconductor part 10. The thickness in the Z-direction of the ninth semiconductor layer 19 is greater than the sum of the thickness in the Z-direction of the second semiconductor layer 12 and the thickness in the Z-direction of the third semiconductor layer 13. The ninth semiconductor layer 19 is connected to the second semiconductor layer 12.

In the semiconductor device 1, the fifth semiconductor layer 15 is not provided between the ninth semiconductor layer 19 and the first electrode 20. The eighth semiconductor layer 18 contacts the first electrode 20 between the ninth semiconductor layer 19 and the first electrode 20.

In the on-state of the diode mode, such a termination structure suppresses the hole injection from the ninth semiconductor layer 19 into the first semiconductor layer 11. In other words, the amount of the electrons can be reduced, which are injected from the first electrode 20 via the fifth semiconductor layer 15 into the region of the first semiconductor layer 11 positioned directly under the ninth semiconductor layer 19. Accordingly, the amount of the holes is also reduced, which are injected from the ninth semiconductor layer 19 into the first semiconductor layer 11. Thus, the carrier density is reduced in the region of the first semiconductor layer 11 that is positioned directly under the ninth semiconductor layer 19. It is possible to suppress the current due to the ejection of the carriers in the turn-off process. Accordingly, the current concentration can be relaxed in the ejection path of the holes from the first semiconductor layer 11 toward the second electrode 30 via the ninth semiconductor layer 19. The device can be prevented from the breakdown due to the overcurrent. From the perspective described above. It is preferable to enlarge the distance from the end of the fifth semiconductor layer 15 to the ninth semiconductor layer 19. On the other hand, the diode characteristics may be degraded when the distance from the end of the fifth semiconductor layer 15 to the ninth semiconductor layer 19 is too long.

According to the embodiment, the semiconductor device 1 has, for example, a distance HD from the end of the fifth semiconductor layer 15 to the ninth semiconductor layer 19 when viewed in plan perpendicular to the Z-direction. The distance HD can be increased in a range that is not more than a distance VD from the first electrode 20 to the ninth semiconductor layer 19. In other words, the fifth semiconductor layer 15 is apart from the region of the eighth semiconductor layer 18 positioned directly under the ninth semiconductor layer 19 with the distance HD. The distance HD is less than the distance VD from the first electrode 20 to the ninth semiconductor layer 19. Thereby, the current flowing in the turn-off process can be suppressed in the termination region while maintaining the diode mode operation.

The carrier trap CT also may be provided between the first electrode 20 and the ninth semiconductor layer 19. Thereby, the carrier density directly under the ninth semiconductor layer 19 can be reduced in the first semiconductor layer 11. The carrier trap CT is provided in the region of the first semiconductor layer 11 directly under the ninth semiconductor layer 19. The distribution of the carrier trap CT has a center in the first semiconductor layer 11. For example, the distance in the Z-direction from the center of the distribution to the ninth semiconductor layer 19 is less than the distance in the Z-direction from the center of the distribution to the first electrode 20.

As shown in FIG. 4B, the control electrode 40 extends from the active region to the termination region. The end of the control electrode 40 is provided between the control interconnect 50 and the ninth semiconductor layer 19. The thickness in the Z-direction of the ninth semiconductor layer 19 is greater than the thickness in the Z-direction of the control electrode 40.

The control electrode 40 is electrically insulated from the ninth semiconductor layer 19 by the first insulating film 43. The third insulating film 47 is provided between the control electrode 40 and the control interconnect 50. The control interconnect 50 is electrically connected to the control electrode 40 via the contact portion 53. The contact portion 53 extends in a contact hole that is provided in the third insulating film 47.

Figure 5:
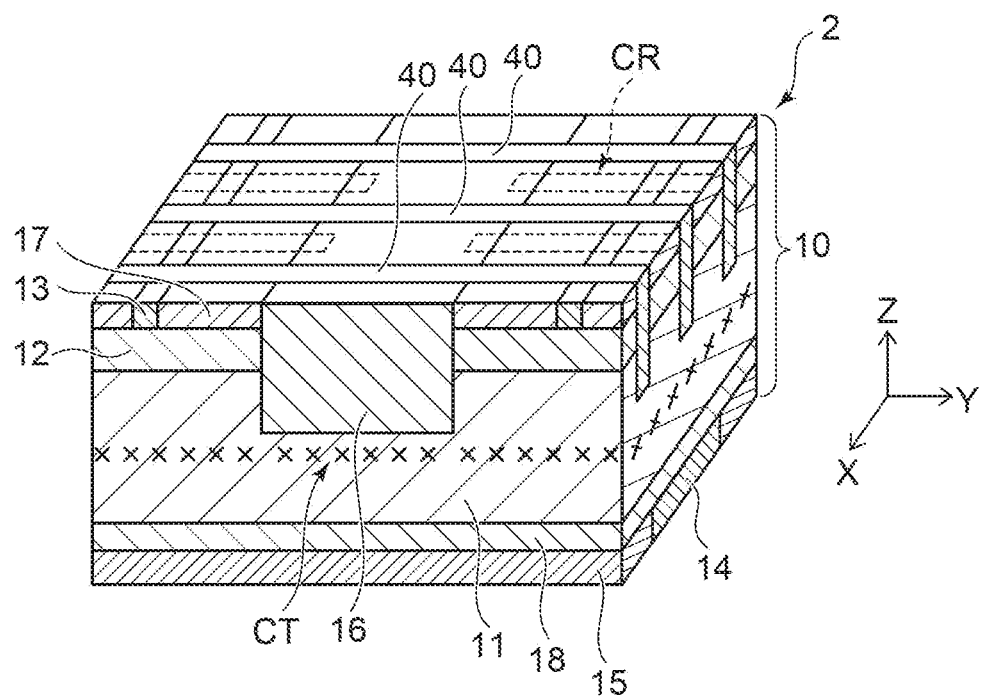
FIG. 5 is a perspective view schematically showing a semiconductor device according to a modification of the embodiment.

FIG. 5 is a perspective view schematically showing a semiconductor device 2 according to a modification of the embodiment. FIG. 5 is a perspective view showing a portion of the semiconductor part 10 that corresponds to region IIB shown in FIG. 2A.

As shown in FIG. 5, in the semiconductor device 2, the carrier trap CT also is provided between the second semiconductor layer 12 and the fifth semiconductor layer 15. Thus, the carrier trap CT may be provided in the entire active region when viewed in plan along the Z-direction. Moreover, the carrier trap CT may be provided in the entire first semiconductor layer 11 when viewed in plan perpendicular to the Z-direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, the device comprising:
    a semiconductor part including a first semiconductor layer of a first conductivity type, a second semiconductor layer of a second conductivity type, a third semiconductor layer of the first conductivity type, a fourth semiconductor layer of the second conductivity type, a fifth semiconductor layer of the first conductivity type, and a sixth semiconductor layer of the second conductivity type;
    a first electrode provided on a back surface of the semiconductor part;
    at least one second electrode provided on a front surface of the semiconductor part,
        the first semiconductor layer extending between the first electrode and the second electrode,
        the second semiconductor layer being provided between the first semiconductor layer and the second electrode,
        the third semiconductor layer being provided between the second semiconductor layer and the second electrode, the third semiconductor layer being electrically connected to the second electrode,
        the fourth semiconductor layer and the fifth semiconductor layer being provided between the first semiconductor layer and the first electrode, the fourth and fifth semiconductor layers being arranged along the back surface of the semiconductor part, the fourth and fifth semiconductor layers being electrically connected to the first electrode;
    a control electrode provided between the semiconductor part and the second electrode,
        the semiconductor part having a trench provided at the front surface side, the control electrode being provided in the trench,
        the control electrode being electrically insulated from the semiconductor part by a first insulating film covering an inner surface of the trench, the control electrode being electrically insulated from the second electrode by a second insulating film, the control electrode facing the first and second semiconductor layers via the first insulating film; and
    a control interconnect provided on the front surface of the semiconductor part with a third insulating film interposed, the control interconnect being apart from the second electrode and electrically connected to the control electrode,
    the sixth semiconductor layer being provided between the first semiconductor layer and the control interconnect,
    the fifth semiconductor layer including a portion provided between the first electrode and the sixth semiconductor layer,
    the first semiconductor layer including a carrier trap, the carrier trap being provided at least between the fifth semiconductor layer and the sixth semiconductor layer,
    the sixth semiconductor layer including a second-conductivity-type impurity with a higher concentration than a concentration of a second-conductivity-type impurity in the second semiconductor layer,
    the sixth semiconductor layer being connected to the second semiconductor layer and electrically connected to the second electrode.

2. The device according to claim 1, wherein
    the sixth semiconductor layer contacts the third insulating film,
    the second semiconductor layer has a first layer thickness in a first direction, the first direction being directed from the first electrode toward the second electrode,
    the third semiconductor layer has a second layer thickness in the first direction,
    the sixth semiconductor layer has a third layer thickness in the first direction, and
    the third layer thickness is greater than a sum of the first layer thickness and the second layer thickness.

3. The device according to claim 1, wherein
    the control electrode extends in a second direction, the second direction being directed along the front surface of the semiconductor part, the fourth semiconductor layer and the fifth semiconductor layer being alternately arranged in the second direction, and
    the sixth semiconductor layer extends in a third direction along the front surface of the semiconductor part, the third direction crossing the second direction.

4. The device according to claim 3, wherein
    the third layer thickness of the sixth semiconductor layer is greater than a distance between the front surface of the semiconductor part and a bottom of the trench, and
    the sixth semiconductor layer includes a portion positioned between the first semiconductor layer and the control electrode.

5. The device according to claim 1, wherein
    the carrier trap is distributed in the first semiconductor layer, and
    a distance in the first direction from a center of the distribution of the carrier trap to the sixth semiconductor layer is less than a distance in the first direction from the center of the distribution of the carrier trap to the fifth semiconductor layer.

6. The device according to claim 1, wherein
    the semiconductor part further includes a seventh semiconductor layer of the second conductivity type,
    the seventh semiconductor layer is provided between the second semiconductor layer and the second electrode,
    the third semiconductor layer and the seventh semiconductor layer are arranged on the second semiconductor layer, the third semiconductor layer contacts the first insulating film, the seventh semiconductor layer is electrically connected to the second electrode, and the second semiconductor layer is electrically connected to the second electrode via the seventh semiconductor layer.

7. The device according to claim 6, wherein the control electrode extends in a second direction, the second direction being directed along the front surface of the semiconductor part, the third semiconductor layer and the seventh semiconductor layer are alternately arranged in the second direction, and the third semiconductor layer has a width in the second direction, the width of the third semiconductor layer being less than a width in the second direction of the seventh semiconductor layer.

8. The device according to claim 1, wherein a plurality of the second electrodes is arranged along the front surface of the semiconductor part, and the control interconnect is provided between two adjacent second electrodes of the plurality of second electrodes.

9. The device according to claim 8, wherein the semiconductor part includes an active region and a termination region, the active region including the second and third semiconductor layers, the termination region surrounding the active region along the front surface of the semiconductor part, the semiconductor part further includes an eighth semiconductor layer of the first conductivity type, and a ninth semiconductor layer of the second conductivity type, the eighth semiconductor layer being provided between the first semiconductor layer and the fourth semiconductor layer and between the first semiconductor layer and the fifth semiconductor layer, the eighth semiconductor layer including a first-conductivity-type impurity with a concentration higher than a concentration of a first-conductivity-type impurity in the first semiconductor layer and lower than a concentration of a first-conductivity-type impurity in the fifth semiconductor layer, the ninth semiconductor layer being provided in the termination region, the ninth semiconductor layer extending along a boundary between the termination region and the active region, the ninth semiconductor layer includes a second-conductivity-type impurity with a higher concentration than the concentration of the second-conductivity-type impurity in the second semiconductor layer, the fifth semiconductor layer is not provided between the first electrode and the ninth semiconductor layer, and the eighth semiconductor layer extends between the first electrode and the ninth semiconductor layer, and contacts the first electrode.

10. The device according to claim 9, wherein the second semiconductor layer has a first layer thickness in a first direction, the first direction being directed from the first electrode toward the second electrode, the third semiconductor layer has a second layer thickness in the first direction, the ninth semiconductor layer has a fourth layer thickness in the first direction, and the fourth layer thickness is greater than a sum of the first layer thickness and the second layer thickness.

11. The device according to claim 9, wherein the fifth semiconductor layer is apart from the ninth semiconductor layer with a first distance in a planar view perpendicular to a first direction, the first direction being directed from the first electrode toward the second electrode, and the ninth semiconductor layer is apart from the first electrode with a second distance in the first direction, the first distance being less than the second distance.

12. The device according to claim 9, wherein the first semiconductor layer includes another carrier trap provided between the first electrode and the ninth semiconductor layer.

13. The device according to claim 9, wherein the control interconnect is electrically connected to an end portion of the control electrode, and the ninth semiconductor layer is provided between the first semiconductor layer and the control interconnect.

14. The device according to claim 1, wherein the carrier trap extends between the second semiconductor layer and the fourth semiconductor layer and between the second semiconductor layer and the fifth semiconductor layer.

* * * * *